(12) United States Patent
Hung et al.

(10) Patent No.: US 10,134,629 B1
(45) Date of Patent: Nov. 20, 2018

(54) METHOD FOR MANUFACTURING A SEMICONDUCTOR STRUCTURE

(71) Applicant: UNITED MICROELECTRONICS CORP., Hsinchu (TW)

(72) Inventors: Ching-Wen Hung, Tainan (TW); Yen-Tsai Yi, Tainan (TW); Wei-Chuan Tsai, Changhua County (TW); En-Chiuan Liou, Tainan (TW); Chih-Wei Yang, Kaohsiung (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 0 days.

(21) Appl. No.: 15/696,267

(22) Filed: Sep. 6, 2017

(51) Int. Cl.
*H01L 21/44* (2006.01)
*H01L 21/768* (2006.01)
*H01L 29/78* (2006.01)
*H01L 23/532* (2006.01)
*H01L 23/535* (2006.01)

(52) U.S. Cl.
CPC .. *H01L 21/76862* (2013.01); *H01L 21/76846* (2013.01); *H01L 21/76864* (2013.01); *H01L 21/76889* (2013.01); *H01L 21/76895* (2013.01); *H01L 23/535* (2013.01); *H01L 23/53266* (2013.01); *H01L 29/7851* (2013.01)

(58) Field of Classification Search
None
See application file for complete search history.

(56) References Cited

U.S. PATENT DOCUMENTS

| 6,004,877 A | 12/1999 | Chang et al. |
| 6,750,146 B2 * | 6/2004 | Huang ............... H01L 21/2855 257/E21.169 |
| 8,415,753 B2 * | 4/2013 | Nakagawa ........ H01L 21/28088 257/412 |
| 2008/0274610 A1 * | 11/2008 | Choi ................. H01L 21/76843 438/653 |
| 2010/0240214 A1 * | 9/2010 | Chiu ....................... C23C 14/16 438/656 |
| 2013/0056836 A1 * | 3/2013 | Yu .................... H01L 21/823807 257/410 |

\* cited by examiner

*Primary Examiner* — Thien F Tran
(74) *Attorney, Agent, or Firm* — WPAT, PC

(57) ABSTRACT

A method for manufacturing a semiconductor structure includes the following steps. At first, a titanium layer is formed on a preformed layer. Then, a first titanium nitride layer is formed on the titanium layer. A first plasma treatment is applied to the first titanium nitride layer such that the first titanium nitride layer has a first N/Ti ratio. A second titanium nitride layer is formed on the first titanium nitride layer. A second plasma treatment is applied to the second titanium nitride layer such that the second titanium nitride layer has a second N/Ti ratio larger than the first N/Ti ratio.

11 Claims, 7 Drawing Sheets

METHOD FOR MANUFACTURING A SEMICONDUCTOR STRUCTURE

TECHNICAL FIELD

This disclosure relates to a method for manufacturing a semiconductor structure. More particularly, this disclosure relates to a method with respect to the formation of a composite barrier layer.

BACKGROUND

In semiconductive devices, interconnections and the like are used for providing electrical connections between components. A widely used material for forming such interconnections and the like is tungsten (W). Typically, before the formation of tungsten, a barrier layer may be conformally formed on an underlying layer for preventing deterioration due to diffusions of elements. Then, a tungsten layer may be deposited on the barrier layer. After removing the redundant portions of the tungsten layer, the interconnections can be provided. In the cases of forming interconnections and the like using other conductive materials, barrier layers may also be provided.

SUMMARY

This disclosure is directed to a method for manufacturing a semiconductor structure, more particularly to a method with respect to the formation of a composite barrier layer.

According to some embodiments, a method for manufacturing a semiconductor structure comprises the following steps. At first, a titanium layer is formed on a preformed layer. Then, a first titanium nitride layer is formed on the titanium layer. A first plasma treatment is applied to the first titanium nitride layer such that the first titanium nitride layer has a first N/Ti ratio. A second titanium nitride layer is formed on the first titanium nitride layer. A second plasma treatment is applied to the second titanium nitride layer such that the second titanium nitride layer has a second N/Ti ratio larger than the first N/Ti ratio.

Figure 1A:
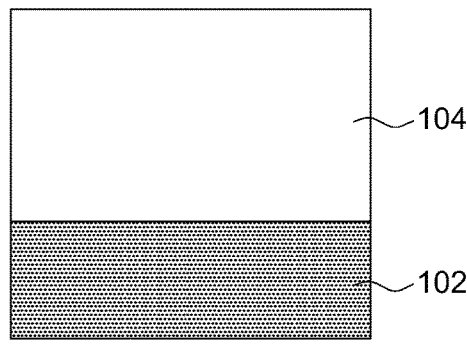
FIGS. 1A-1H illustrate various stages of a method for manufacturing a semiconductor structure according to embodiments.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Various embodiments will be described more fully hereinafter with reference to accompanying drawings. For clarity, the components in the figures may not be drawn to scale. Spatially relative terms, such as "on", "under", and the like, used herein are intended to encompass different orientations of the structures in addition to the conditions illustrated in the drawings. For example, the structure shown in some figures may be rotated 90 degrees. It is contemplated that elements and features of one embodiment may be beneficially incorporated in another embodiment without further recitation.

Referring to FIGS. 1A-1H, a method for manufacturing a semiconductor structure according to embodiments is illustrated. As shown in FIG. 1A, on a preformed layer 102, a titanium layer 104 is formed. In some embodiments, the preformed layer 102 comprises silicon (Si). For example, the preformed layer 102 may be formed of epitaxial silicon, silicide, silicon oxide, or any other Si-containing material. In some embodiments, before the formation of the titanium layer 104, a heating process and a pre-cleaning process may be conducted. The titanium layer 104 may be formed by a sputtering process. The titanium layer 104 can be a glue layer.

Figure 1B:
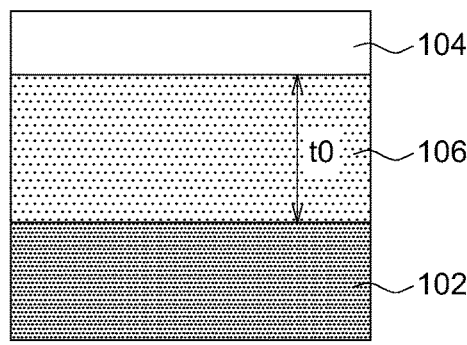
Figure 1C:
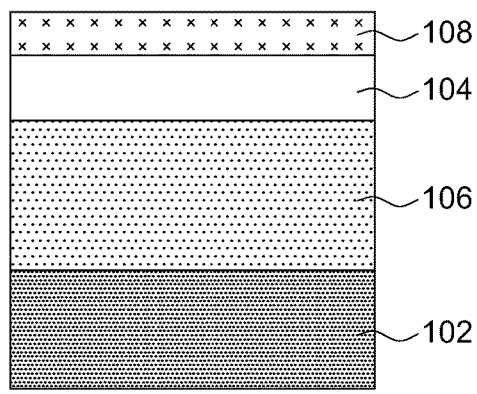

In some embodiments, as shown in FIG. 1B, a titanium silicide layer 106 may be formed between the preformed layer 102 and the titanium layer 104 due to a diffusion of elements, such as a diffusion of silicon from the preformed layer 102 to the titanium layer 104. The titanium silicide layer 106 formed due to the diffusion may have a thickness to.

As shown in FIG. 10, a first titanium nitride layer 108 is formed on the titanium layer 104. The first titanium nitride layer 108 may be formed by a deposition process. According to some embodiments, the deposition process may be a metal organic chemical vapor deposition (MOCVD) process. In the MOCVD process, nitrogen gas ($N_2$) may be provided at a flow rate of 1000 sccm to 3000 sccm, hydrogen gas ($H_2$) may be provided at a flow rate of 1000 sccm to 3000 sccm, TDMAT ($Ti[N(CH_3)_2]_4$) gas may be provided at a flow rate of 20 sccm to 80 sccm, the processing temperature may be 395° C. to 405° C., and the pressure may be 1 torr to 7 torr.

Figure 1D:
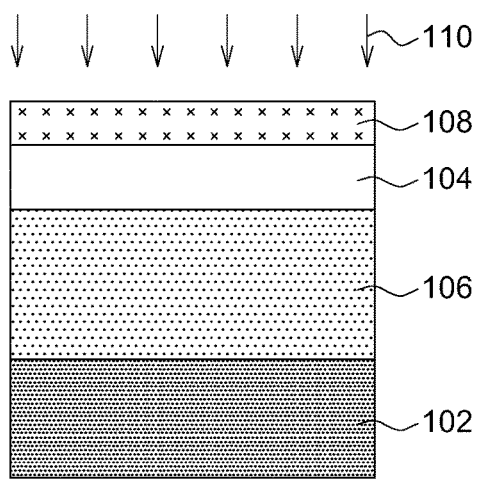

As shown in FIG. 1D, a first plasma treatment 110 is applied to the first titanium nitride layer 108 such that the first titanium nitride layer 108 has a first N/Ti ratio. The composition of the first titanium nitride layer 108 can be adjusted by the first plasma treatment 110. The first plasma treatment 110 may be a $H_2/N_2$ plasma treatment, i.e., a plasma treatment in which $H_2$ plasma and $N_2$ plasma are provided. The first plasma treatment 110 is applied for a first time period. According to some embodiments, the first time period is in a range from 4 seconds to 20 seconds. For example, the first time period may be in a range from 4 seconds to 18 seconds. According to some embodiments, the first N/Ti ratio may be in a range from 1.04 to 1.28. In other words, for every 100 titanium elements in the first titanium nitride layer 108, there may be 104 nitrogen elements to 128 nitrogen elements in the first titanium nitride layer 108.

Figure 1E:
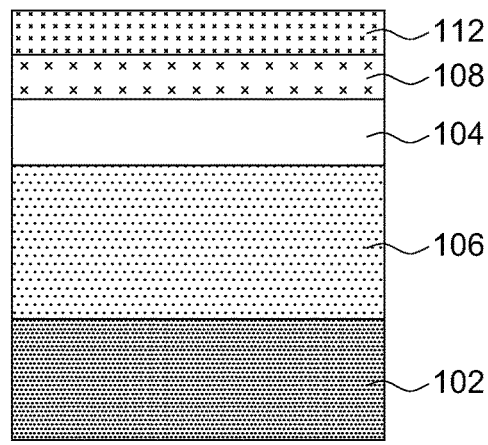

As shown in FIG. 1E, a second titanium nitride layer 112 is formed on the first titanium nitride layer 108. The second titanium nitride layer 112 may be formed by a deposition process, such as the same MOCVD process as for the formation of the first titanium nitride layer 108.

Figure 1F:
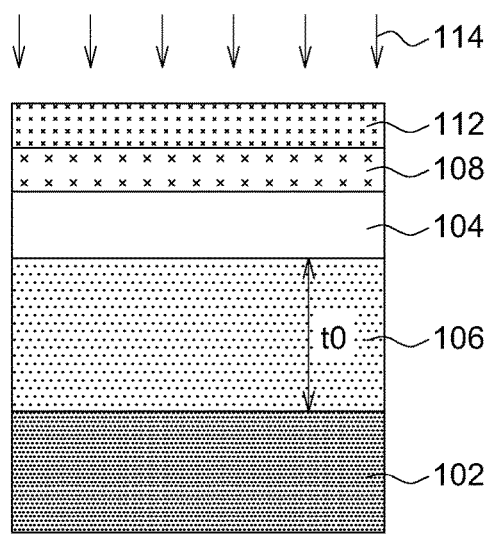

As shown in FIG. 1F, a second plasma treatment 114 is applied to the second titanium nitride layer 112 such that the second titanium nitride layer 112 has a second N/Ti ratio larger than the first N/Ti ratio. The composition of the second titanium nitride layer 112 can be adjusted by the second plasma treatment 114. Similar to the first plasma treatment 110, the second plasma treatment 114 may be a H$_2$/N$_2$ plasma treatment. The second plasma treatment 114 is applied for a second time period. According to some embodiments, the second time period is in a range from 8 seconds to 30 seconds. For example, the second time period is in a range from 10 seconds to 30 seconds. The second time period is longer than the first time period. Similar to the first N/Ti ratio, according to some embodiments, the second N/Ti ratio may be in a range from 1.04 to 1.28. However, the second N/Ti ratio is larger than the first N/Ti ratio. In other words, the second titanium nitride layer 112 applied with the second plasma treatment 114 is more N-rich than the first titanium nitride layer 108 applied with the first plasma treatment 110. The first titanium nitride layer 108 and the second plasma treatment 114 can be barrier layers. According to some embodiments, the first titanium nitride layer 108 and the second plasma treatment 114 provide a composite barrier layer.

Figure 2A:
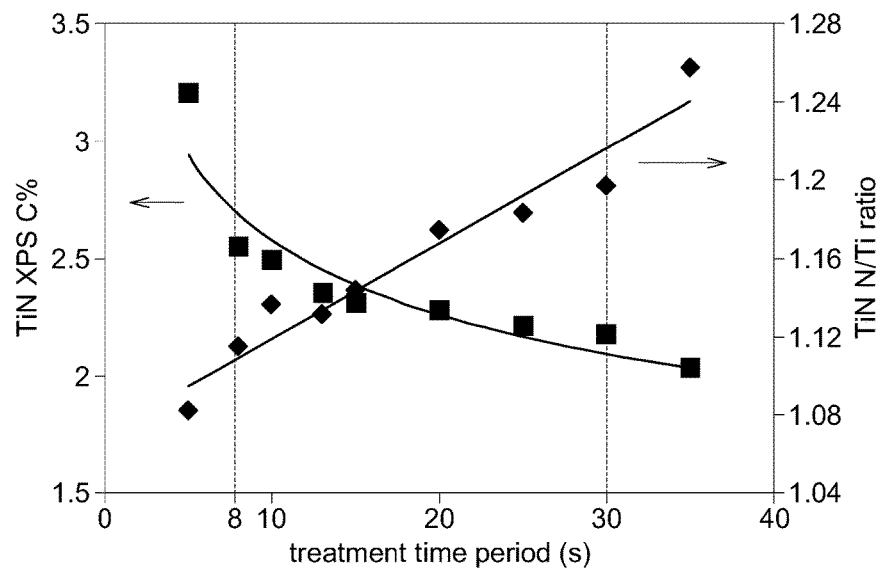
FIGS. 2A-2B illustrate effects of the plasma treatment time period on a titanium nitride layer.
Figure 2B:
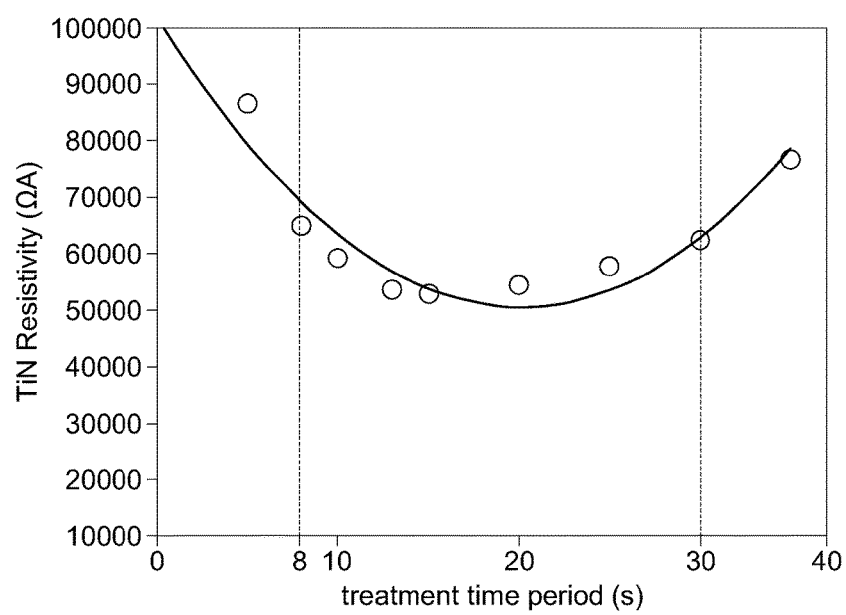

Now the effects of the plasma treatment on the titanium nitride layer are described with reference to FIGS. 2A-2B. Referring to FIG. 2A, as the time period of the plasma treatment increases, the N/Ti ratio of the titanium nitride layer increases. A higher N/Ti ratio can provide a better adhesion to the underlying layer. However, the resistivity increases as the N/Ti ratio becomes higher. Still referring to FIG. 2A, the MOCVD process as described above may be used to form the titanium nitride layer, and in such cases, carbon from TDMAT gas may remain in the titanium nitride layer and lead to a higher resistivity. Carbon can be removed through the plasma treatment. Since both the higher carbon amount and the higher N/Ti ratio will lead to the increase of the resistivity of a titanium nitride layer, the change of the resistivity along the treatment time period looks like a smile curve, as shown in FIG. 2B. In some embodiments, for keeping a lower resistivity, a suitable treatment period (particular for the second plasma treatment) is selected from 8 seconds to 30 seconds, and the N/Ti ratio will be in a range from 1.04 to 1.28.

As described above, the time period of the plasma treatment leads to the change of N/Ti ratio. As such, in some embodiments, the composition difference between the first titanium nitride layer 108 and the second plasma treatment 114 can be provided by only the shorter first time period and the longer second time period, while all other conditions for the formations and plasma treatments of the first titanium nitride layer 108 and the second plasma treatment 114 are the same.

Figure 1G:
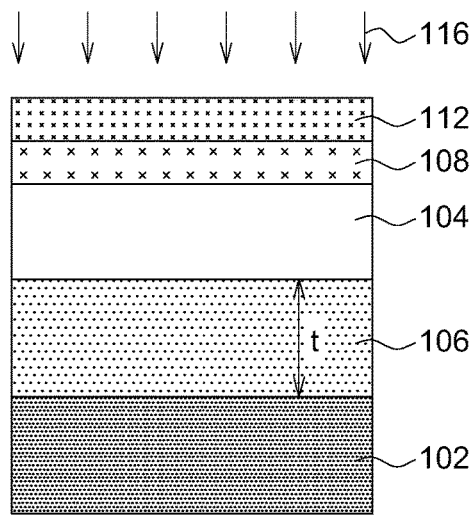
Figure 1H:
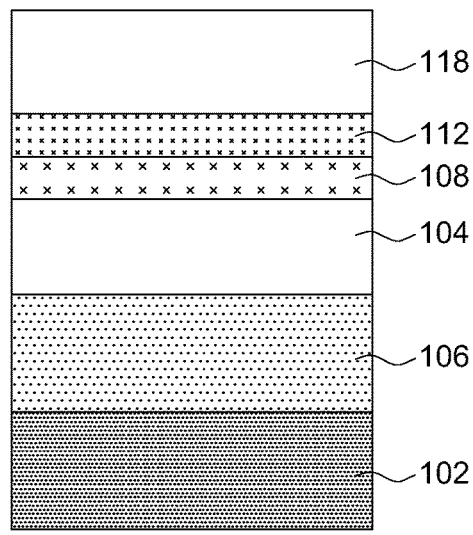

After the second plasma treatment 114, as shown in FIG. 1G, a rapid thermal process 116 may be conducted for annealing. According to some embodiments, a thickness of the titanium silicide layer 106 can be adjusted by the rapid thermal process 116. The titanium silicide layer 106 experiencing the rapid thermal process 116 has a thickness t thinner than the original thickness t0. As the time period of the rapid thermal process 116 increases, the thickness t of the titanium silicide layer 106 becomes thinner. The equivalent resistance between the preformed layer 102 and the conductive structure (such as the tungsten structure 118 as shown in FIG. 1H) may thereby increase. According to some embodiments, the time period of the rapid thermal process 116 is no longer than 60 seconds, such as about 30 seconds. In some embodiments, after the rapid thermal process 116, the titanium layer 104, the first titanium nitride layer 108, and the second titanium nitride layer 112 look like a titanium nitride layer with gradient nitrogen concentration due to the diffusion of nitrogen.

Then, a conductive structure may be formed. In some embodiments, as shown in FIG. 1H, a tungsten structure 118 is formed on the second titanium nitride layer 112.

In the method described above, two titanium nitride layers are formed. The higher second N/Ti ratio of the second titanium nitride layer 112 provides a better adhesion for the composite barrier layer on the titanium layer 104 and the preformed layer 102 without deterioration of the resistance by selecting a suitable second time period (such as 8 seconds to 30 seconds). The lower first N/Ti ratio of the first titanium nitride layer 108 is beneficial for keeping the desired low resistance since less nitrogen elements will diffuse into the titanium layer 104, wherein the nitrogen elements diffusing into the titanium layer 104 will lead to the formation of high-resistance titanium nitride in the titanium layer 104 and constrict the volume of the low-resistance titanium silicide layer 106.

Figure 3:
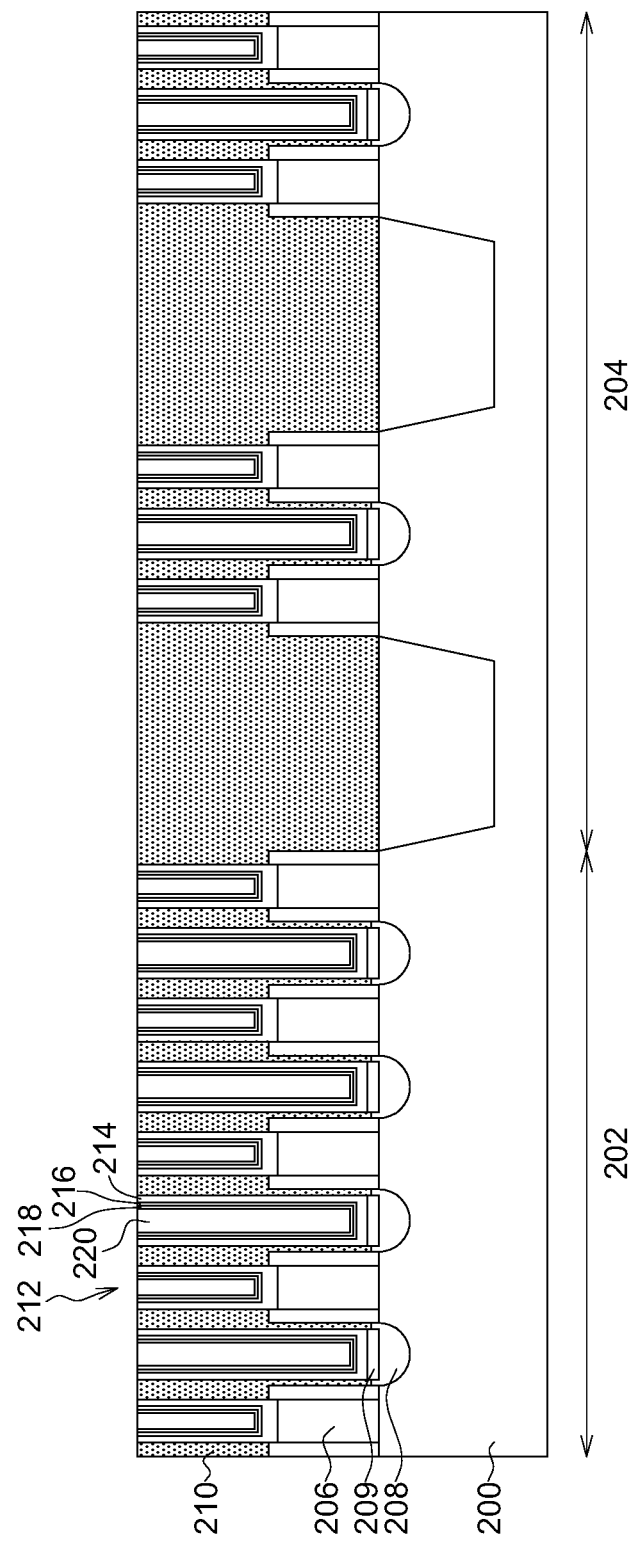
FIG. 3 illustrates a semiconductor structure manufactured applying the method according to embodiments.
Figure 4:
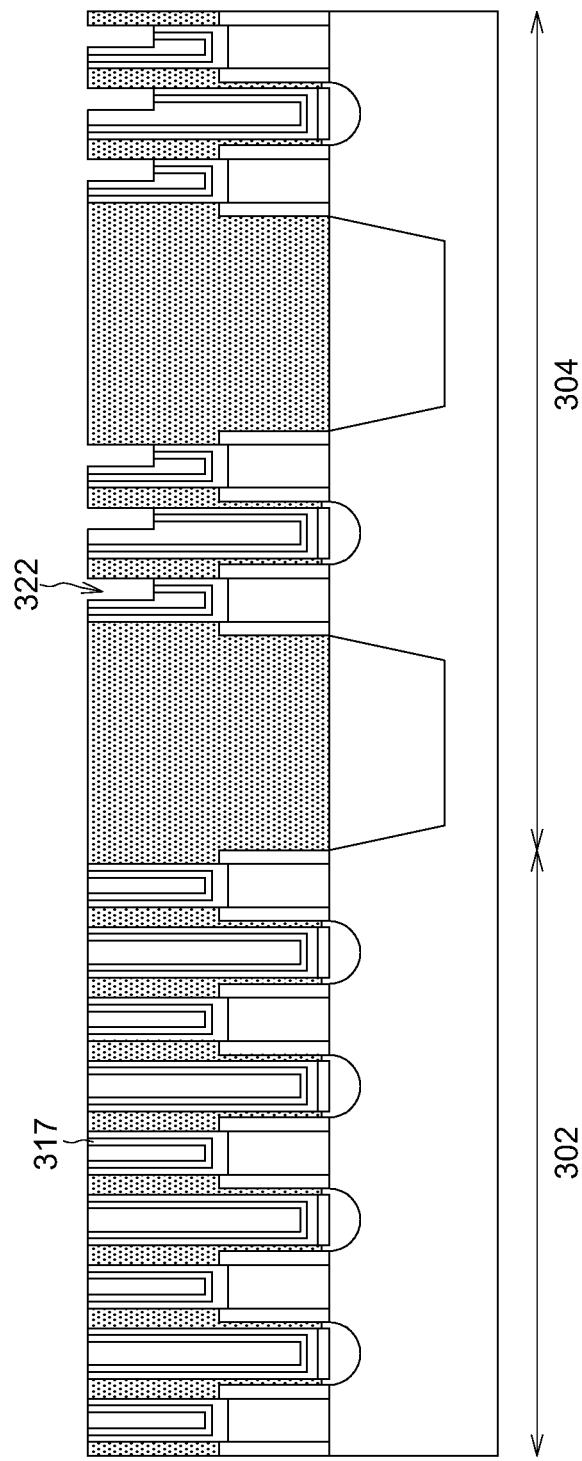
FIG. 4 illustrates a semiconductor structure manufactured by the conventional method.

Referring to FIG. 3, an exemplary semiconductor structure manufactured applying the method according to embodiments is shown. The semiconductor structure may have a dense area 202 and a loose area 204. In the dense area 202, the components are formed with a high density. While in the area 204, the components are formed with a lower density. The exemplary semiconductor structure comprises a substrate 200. Metal gate structures 206 and epitaxial silicon regions 208, which may be provided for finFET devices, are alternately formed. Silicides 209 may be formed on the epitaxial silicon regions 208, respectively. A dielectric layer 210 formed of silicon oxide is disposed on the above components. A plurality of openings 210 are formed in the dielectric layer 210 and expose the metal gate structures 206 and the epitaxial silicon regions 208 on which interconnections should be provided. Titanium layers 214, first titanium nitride layers 216, and second titanium nitride layer 218 are sequentially formed in the openings 210 in a conformal manner, and tungsten structures 220 are formed in the openings 210 as the interconnections. The method according to embodiments can be applied in both the dense area 202 and the loose area 204, and particularly suitable for the loose area 204. Referring to FIG. 4, a comparative semiconductor structure manufactured by a conventional method is shown. Such semiconductor structure comprises only one titanium nitride layer 317 as the barrier layer. After a chemical mechanical polarization (CMP) process, which is used to remove redundant material for the formation of the interconnections, defects 320 may be produced in the loose area 304. This is because a worse adhesion of the titanium nitride barrier layer and the higher stress caused by the CMP process in the loose area 304 than the dense area 302.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A method for manufacturing a semiconductor structure, comprising:
   forming a titanium layer on a preformed layer;
   forming a first titanium nitride layer on the titanium layer;
   applying a first plasma treatment to the first titanium nitride layer such that the first titanium nitride layer has a first N/Ti ratio;
   forming a second titanium nitride layer on the first titanium nitride layer;

applying a second plasma treatment to the second titanium nitride layer such that the second titanium nitride layer has a second N/Ti ratio larger than the first N/Ti ratio.

2. The method according to claim 1, wherein the first plasma treatment and the second plasma treatment are $H_2/N_2$ plasma treatments.

3. The method according to claim 1, wherein the first plasma treatment is applied for a first time period, and the second plasma treatment is applied for a second time period longer than the first time period.

4. The method according to claim 3, wherein the first time period is in a range from 4 seconds to 18 seconds.

5. The method according to claim 3, wherein the second time period is in a range from 10 seconds to 30 seconds.

6. The method according to claim 1, wherein the first N/Ti ratio and the second N/Ti ratio are in a range from 1.04 to 1.28.

7. The method according to claim 1, further comprising:
after the second plasma treatment, conducting a rapid thermal process; and
forming a tungsten structure on the second titanium nitride layer.

8. The method according to claim 7, wherein the preformed layer comprises silicon.

9. The method according to claim 8, wherein a titanium silicide layer is formed between the preformed layer and the titanium layer due to a diffusion of silicon from the preformed layer to the titanium layer, and a thickness of the titanium silicide layer is adjusted by the rapid thermal process.

10. The method according to claim 1, wherein the semiconductor structure has a dense area and a loose area, and the preformed layer, the titanium layer, the first titanium nitride layer, the second titanium nitride layer and the tungsten structure are formed in the loose area.

11. The method according to claim 1, wherein the semiconductor structure has a dense area and a loose area, and the preformed layer, the titanium layer, the first titanium nitride layer, the second titanium nitride layer and the tungsten structure are formed in both the dense area and the loose area.

* * * * *